(12) United States Patent
Ryu et al.

(10) Patent No.: US 10,845,903 B2
(45) Date of Patent: Nov. 24, 2020

(54) DISPLAY DEVICE INCLUDING TOUCH SENSOR AND MANUFACTURING METHOD THEREOF

(71) Applicant: SAMSUNG DISPLAY CO., LTD., Yongin-si (KR)

(72) Inventors: Yong-Hwan Ryu, Yongin-si (KR); Young Dae Kim, Yongin-si (KR); Hee Na Kim, Yongin-si (KR); Sang Jin Park, Yongin-si (KR); Tae Hyeok Choi, Yongin-si (KR); Eui Kang Heo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 77 days.

(21) Appl. No.: 15/964,378

(22) Filed: Apr. 27, 2018

(65) Prior Publication Data
US 2019/0073071 A1 Mar. 7, 2019

(30) Foreign Application Priority Data

Sep. 7, 2017 (KR) .................. 10-2017-0114586

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *H01L 27/323* (2013.01); *H01L 51/525* (2013.01); *G06F 2203/04102* (2013.01); *G06F 2203/04103* (2013.01); *G06F 2203/04111* (2013.01); *G06F 2203/04112* (2013.01)

(58) Field of Classification Search
CPC ............... G06F 3/0412; G06F 3/044; G06F 2203/04102; G06F 2203/04103; G06F 2203/04112; H01L 27/323
See application file for complete search history.

(56) References Cited

U.S. PATENT DOCUMENTS

2014/0043546 A1* 2/2014 Yamazaki ........... G02F 1/13338
349/12
2014/0307189 A1* 10/2014 Yim ................. G02F 1/133345
349/33
(Continued)

FOREIGN PATENT DOCUMENTS

KR 10-2002-0095211 A 12/2002
KR 10-2013-0009520 A 1/2013
(Continued)

*Primary Examiner* — Kent W Chang
*Assistant Examiner* — Sujit Shah
(74) *Attorney, Agent, or Firm* — Lewis Roca Rothgerber Christie LLP

(57) ABSTRACT

A display device includes a peripheral area around a display area, a display element in the display area, and a dam in the peripheral area. A thin film encapsulation layer covers the dam and the display element. A touch sensor is on the thin film encapsulation layer. A first insulating layer is between the thin film encapsulation layer and the touch sensor and has a first region and a second region. A dielectric constant of the first region is lower than a dielectric constant of the second region, and the first region is between the dam and the touch sensor.

16 Claims, 14 Drawing Sheets

(51) Int. Cl.
*H01L 27/32* (2006.01)
*H01L 51/52* (2006.01)

(56) References Cited

U.S. PATENT DOCUMENTS

| | | | |
|---|---|---|---|
| 2015/0090983 A1* | 4/2015 | Ozawa | H01L 27/3279 257/40 |
| 2015/0169094 A1* | 6/2015 | Liu | G06F 3/044 345/173 |
| 2015/0220202 A1* | 8/2015 | Choung | G06F 3/0416 345/174 |
| 2016/0274727 A1* | 9/2016 | Nakamura | G06F 3/044 |
| 2017/0205874 A1* | 7/2017 | Miyaguchi | G06F 3/012 |
| 2017/0357345 A1* | 12/2017 | Ikeda | G06F 3/0412 |

FOREIGN PATENT DOCUMENTS

| KR | 10-2016-0063121 A | 6/2016 |
|---|---|---|
| KR | 10-2016-0124319 A | 10/2016 |

\* cited by examiner

DISPLAY DEVICE INCLUDING TOUCH SENSOR AND MANUFACTURING METHOD THEREOF

CROSS-REFERENCE TO RELATED APPLICATION

Korean Patent Application No. 10-2017-0114586, filed Sep. 7, 2017, and entitled, "Display Device Including Touch Sensor and Manufacturing Method Thereof," is incorporated by reference herein in its entirety.

BACKGROUND

1. Field

One or more embodiments described herein relate to a display device including a touch sensor and a method for manufacturing a display device.

2. Description of the Related Art

A display may include a touch sensor for inputting information based on the touch position of a finger or pen. Various touch sensors have been developed. For example, a capacitive-type touch sensor senses the position on a display screen where a capacitance change occurs as the result of a touch. The capacitance change is linked to information or an operation of the display.

Recently, flexible displays have been developed. Some of them include a touch sensor. An on-cell type of touch sensor does not include its own substrate. In this case, a sensing electrode of the touch sensor is directly formed on a component of the display device.

The sensing electrode is in the display area and is connected to a driving circuit in a peripheral area. During manufacture, organic material may drain from the display area into the peripheral area. This may cause a degradation in display quality. Thus, the display may be equipped with at least one dam to prevent the organic material from draining into the peripheral area where the connection wiring is located.

However, the dam overlaps the connection wiring. Thus, the thickness of a thin film encapsulation layer between the dam and the connection wiring may decrease. This may cause parasitic capacitance to increase between a cathode positioned on the dam and the connection wiring. As a result, pixel defects may easily form. One attempt to overcome this problem involves increasing the thickness of the thin film encapsulation layer. However, increasing the thickness of the thin film encapsulation layer may increase manufacturing costs.

SUMMARY

In accordance with one or more embodiments, a display device includes a substrate including a peripheral area around a display area; a display element in the display area; a dam in the peripheral area; a thin film encapsulation layer covering the dam and the display element; a touch sensor on the thin film encapsulation layer; and a first insulating layer between the thin film encapsulation layer and the touch sensor and having a first region and a second region, wherein a dielectric constant of the first region is lower than a dielectric constant of the second region and wherein the first region is between the dam and the touch sensor.

The touch sensor may include a sensing electrode in the display area and connection wiring in the peripheral area, the connection wiring may overlap the dam on a plane view, and the first region may be between the dam and the connection wiring. The first region may overlap part of the connection wiring on a plane view.

The sensing electrode may include a plurality of first fine lines, the connection wiring may include a plurality of second fine lines, the plurality of first fine lines may be connected to have a mesh shape, the second fine lines may be connected to have a mesh shape, and the second fine lines may overlap the first region on a plane view.

The display device may include a second insulating layer covering the sensing electrode, the connection wiring, and the first insulating layer; auxiliary wiring on the second insulating layer and connected to the sensing electrode and the connection wiring; and a third insulating layer covering the auxiliary wiring and the second insulating layer, wherein the auxiliary wiring includes a plurality of third fine lines, the plurality of third fine lines are connected to have a mesh shape, and the third fine lines overlap the first region on a plane view.

The first region may be between the display element and the sensing electrode, and the first region may overlap the sensing electrode on a plane view. The first fine lines may overlap the first region on a plane view. The display element may include a transistor and an organic light emitting diode connected to the transistor, the organic light emitting diode may include a first electrode facing a second electrode and an emission layer between the first electrode and the second electrode, the second electrode may be on the dam, and the first region may overlap the second electrode on the dam.

In accordance with one or more other embodiments, a method for manufacturing a display device includes forming a display element and a thin film encapsulation layer covering the display element on a substrate; forming a first insulating layer on the thin film encapsulation layer; patterning the first insulating layer to form an opening; filling a conductive layer in the opening and planarizing the conductive layer; forming a touch sensor on the first insulating layer and the conductive layer; removing the conductive layer; and forming a second insulating layer on the touch sensor, wherein a dielectric constant of the first region is lower than a dielectric constant of the second region.

The second insulating layer may fill the opening to form a first region of the first insulating layer, and the dielectric constant of the first region may be lower than the dielectric constant of a second region as a remaining region of the first insulating layer. The substrate may include a peripheral area around a display area, the touch sensor may include a sensing electrode in the display area and connection wiring in the peripheral area, and the connection wiring may overlap the first region on a plane view.

The sensing electrode may include a plurality of first fine lines, the connection wiring may include a plurality of second fine lines, the plurality of first fine lines may be connected to have a mesh shape, the plurality of second fine lines may be connected to have a mesh shape, and the second fine lines may overlap the first region on a plane view. The second insulating layer may not fill the opening, and the opening may form a first region of the first insulating layer.

In accordance with one or more other embodiments, a method for manufacturing a display device includes forming a display element and a thin film encapsulation layer covering the display element on a substrate; forming a first insulating layer on the thin film encapsulation layer; patterning the first insulating layer to form an opening; forming an organic layer on the first insulating layer; entirely exposing the organic layer for planarizing the organic layer filled in the opening; forming a touch sensor on the first insulating layer and the organic layer; and forming a second insulating layer on the touch sensor, wherein a dielectric constant of the organic layer is lower than a dielectric constant of the first insulating layer.

The organic layer may fill the opening to form a first region of the first insulating layer, and the dielectric constant of the first region may be lower than the dielectric constant of a second region as a remaining region of the first insulating layer. The substrate may include a peripheral area around a display area, the touch sensor may include a sensing electrode in the display area and connection wiring in the peripheral area, and the connection wiring may overlap the first region on a plane view.

The sensing electrode may include a plurality of first fine lines, the connection wiring may include a plurality of second fine lines, the first fine lines may be connected to have a mesh shape, the plurality of second fine lines may be connected to have a mesh shape, and the second fine lines may overlap the first region on a plane view.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
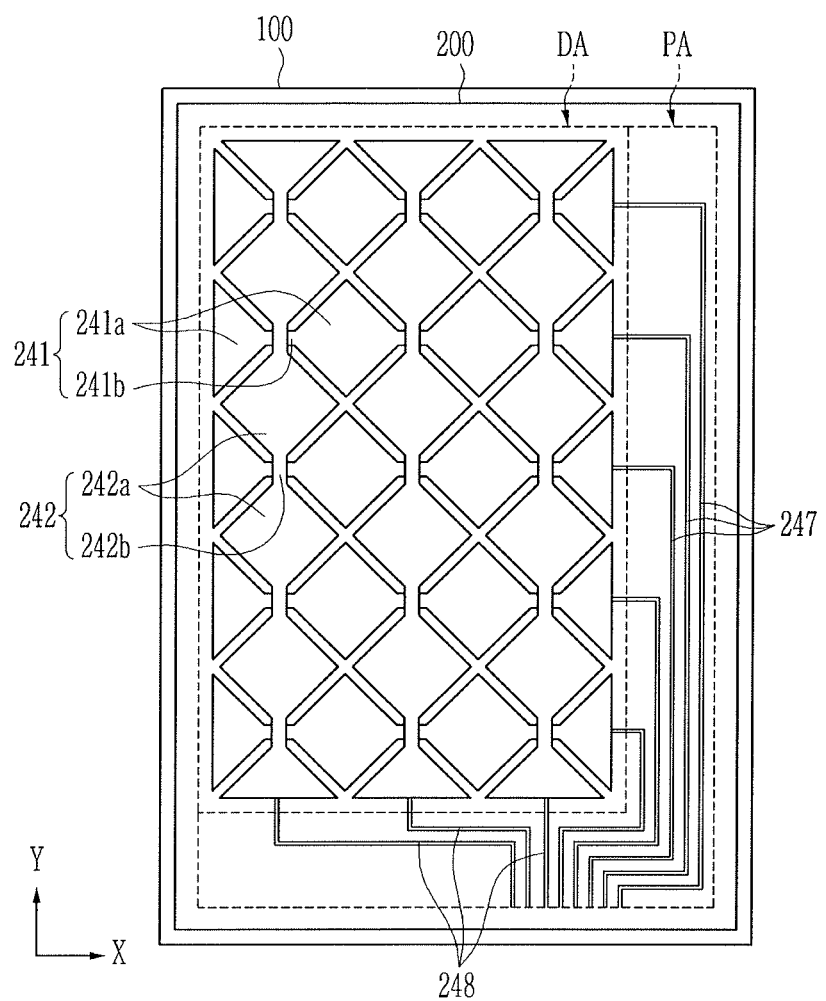
FIG. 1 illustrates an embodiment of a display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
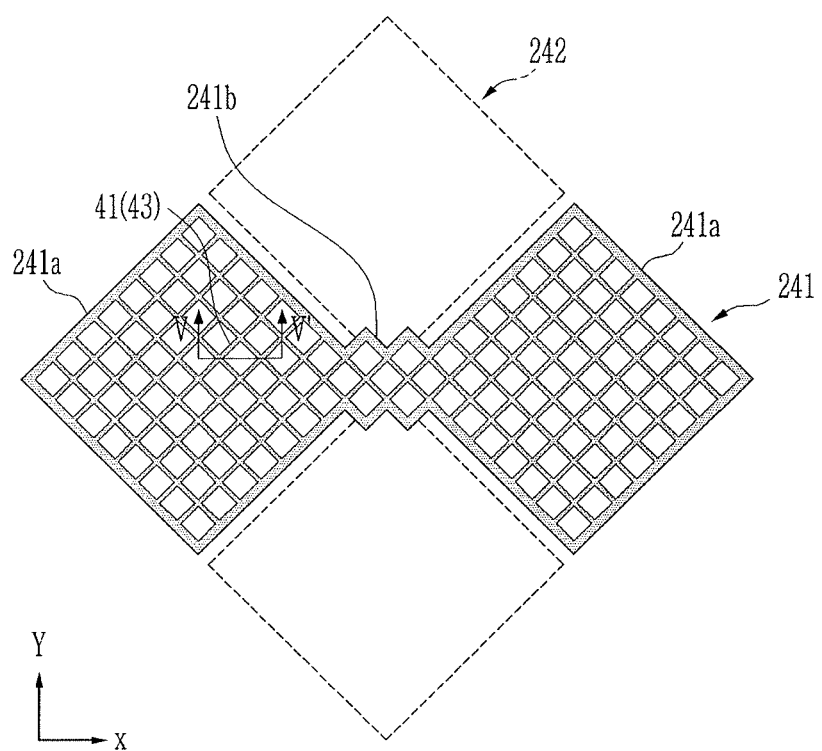
FIG. 2 illustrates an embodiment of a first sensing electrode.
Figure 3:
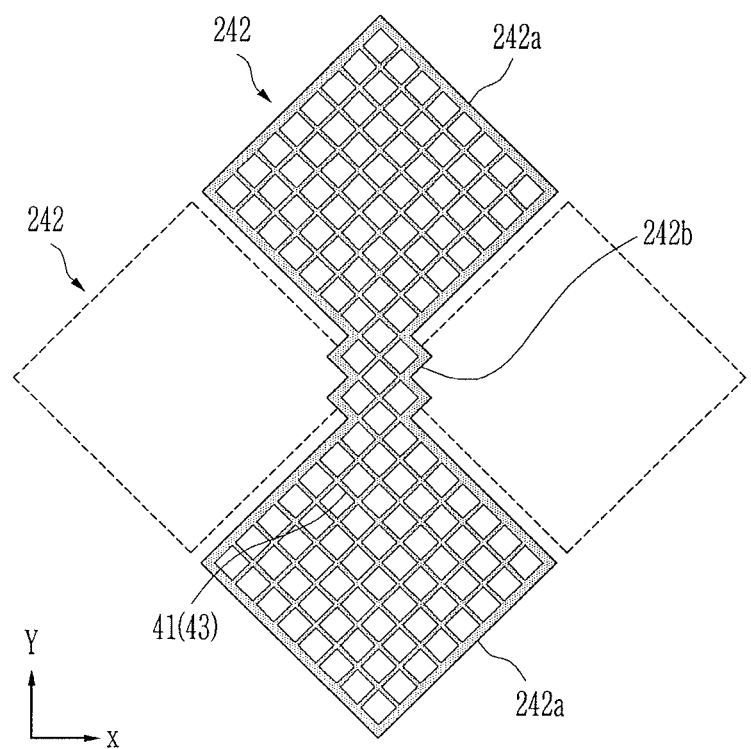
FIG. 3 illustrates an embodiment of a second sensing electrode.
Figure 4:
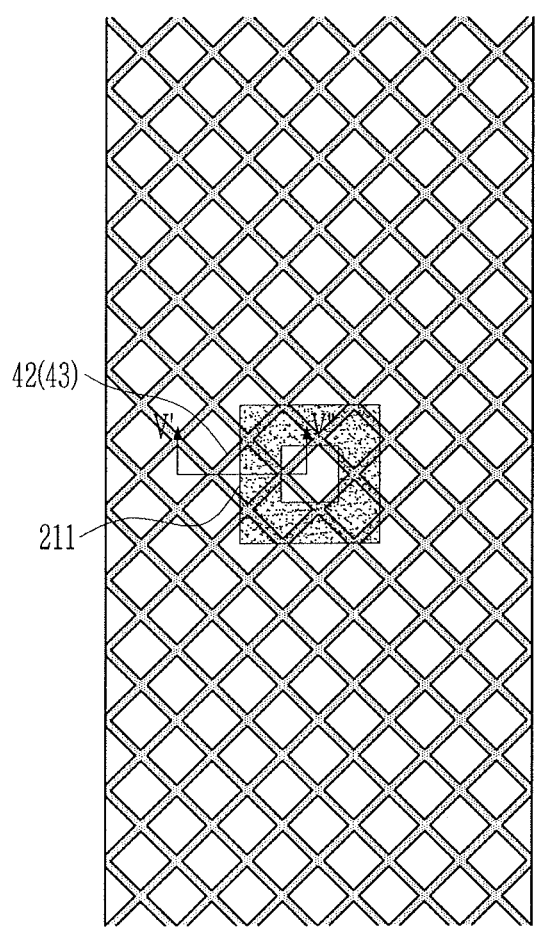
FIG. 4 illustrates an embodiment of connection wiring.
Figure 5:
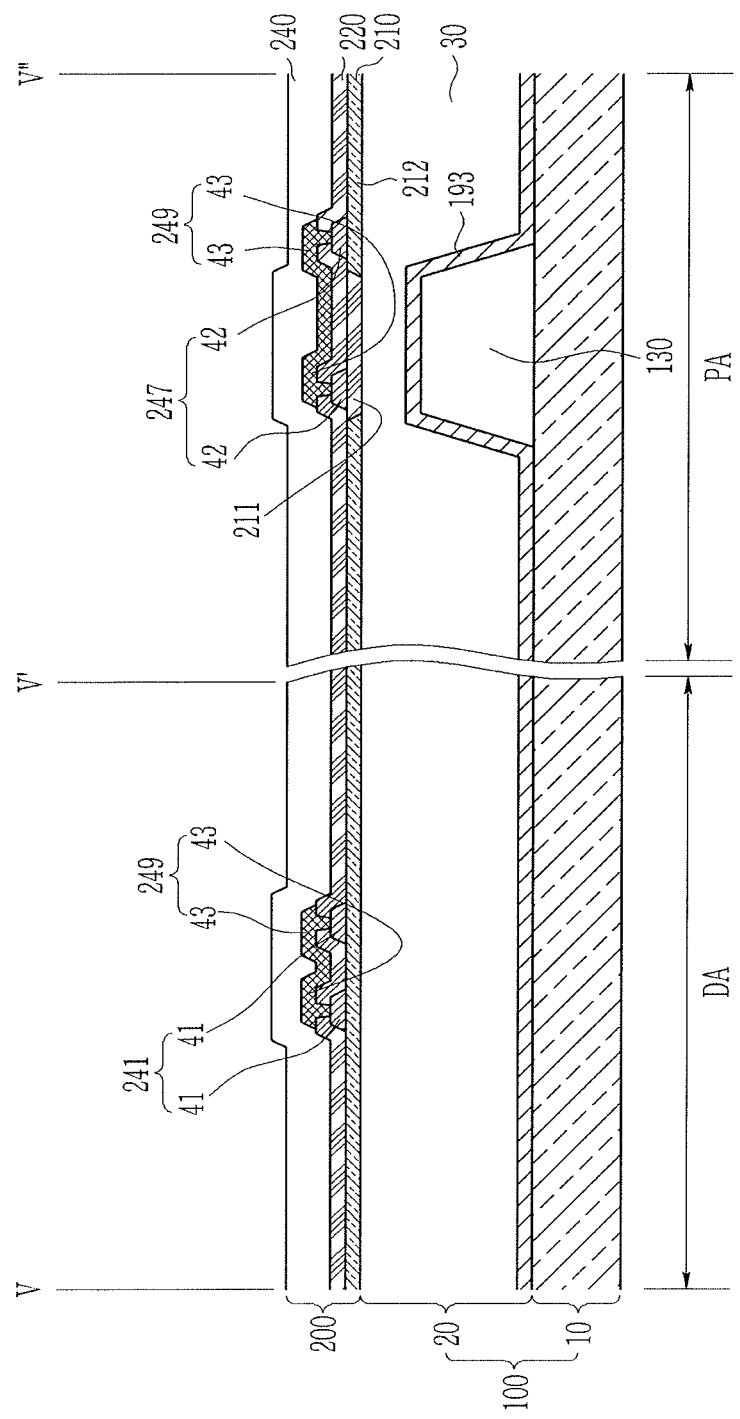
FIG. 5 illustrates a cross-sectional view taken along line V-V' in FIG. 2 and line V'-V'' in FIG. 4.
Figure 6:
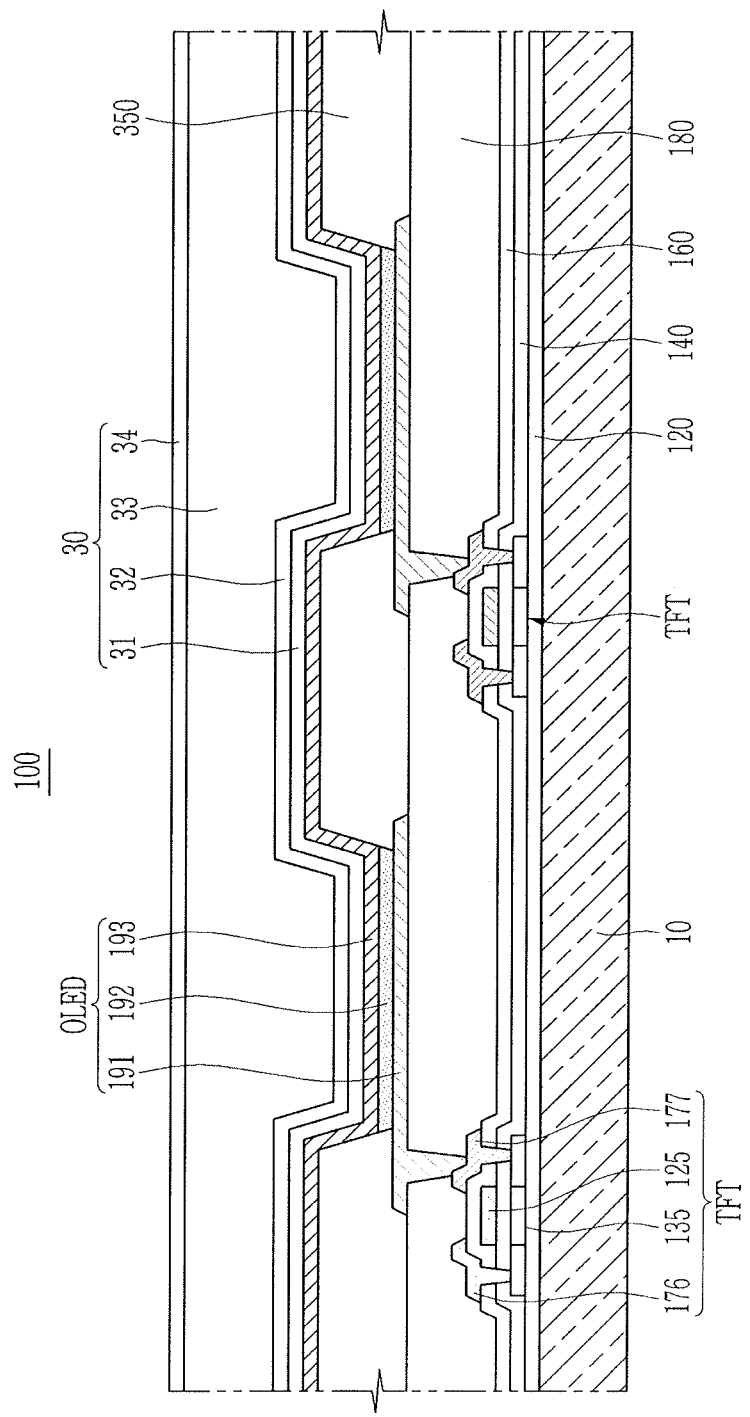
FIG. 6 illustrates a cross-sectional embodiment of a displaying member.

FIG. 1 illustrates a top plan view of an embodiment of a display device. FIG. 2 illustrates a partial top plan view of a first sensing electrode of FIG. 1. FIG. 3 illustrates a partial top plan view of a second sensing electrode of FIG. 1. FIG. 4 illustrates a partial top plan view of connection wiring of FIG. 1. FIG. 5 illustrates a cross-sectional view taken along a line V-V' of FIG. 2 and a line V'-V'' of FIG. 4. FIG. 6 illustrates a partial enlarged cross-sectional view of a displaying member of FIG. 2.

Referring to FIGS. 1 and 5, the display device includes a display panel 100 for displaying an image and a touch sensor 200 on the display panel 100. The display panel 100 may be an organic light emitting diode display or another type of display panel.

As illustrated in FIG. 5, the display panel 100 includes a substrate 10 and a displaying member (or display element) 20 on the substrate 10. The substrate 10 includes a display area DA for displaying the image and a peripheral area PA around the display area. The substrate 10 may be an insulating substrate made of glass, quartz, ceramic, plastic, or the like, or a metallic substrate composed of stainless steel, etc.

As illustrated in FIG. 6, in the displaying member 20, a buffer layer 120 is on the substrate 10. The buffer layer 120 may serve to block impurities from the substrate 110 in order to improve characteristics of polysilicon at the time of a crystallization process for forming polysilicon and to planarize the substrate 110 in order to mitigate stress of the semiconductor formed on the buffer layer 120. The buffer layer 120 may be made of a silicon nitride (SiNx), a silicon oxide (SiOx), or the like.

A semiconductor 135 is on the buffer layer 120 of the display area DA. The semiconductor 135 may be made of a polysilicon or an oxide semiconductor. The semiconductor 135 includes a source region and a drain region at respective sides of a channel region and doped with an impurity. A gate insulating layer 140 is on the semiconductor 135, and a gate electrode 125 is on the gate insulating layer 140. The gate electrode 125 overlaps the channel region of the semiconductor 135. The gate insulating layer 140 may be formed of a silicon nitride (SiNx), a silicon oxide (SiOx), and the like.

An interlayer insulating layer 160 is on the gate electrode 125, and a source electrode 176 and a drain electrode 177 are on the interlayer insulating layer 160. The source electrode 176 and the drain electrode 177 are respectively connected to the source region and the drain region of the semiconductor 135 through contact holes in the interlayer insulating layer 160 and the gate insulating layer 140. A thin film transistor (TFT) illustrated in FIG. 6 is a driving thin film transistor covered by a planarization layer 180.

A pixel electrode 191 is a first electrode positioned on the planarization layer 180. One pixel electrode 191 is formed for each pixel and is connected to the drain electrode 177 of the driving thin film transistor (TFT) through a via hole in the planarization layer 180. A pixel definition layer 350 is on the planarization layer 180 and the pixel electrode 191. The pixel definition layer 350 forms an opening to expose a center part of the pixel electrode 191 on which an emission layer 192 will be positioned.

The emission layer 192 is on the pixel electrode 191. A common electrode 193 is a second electrode positioned on the emission layer 192 and the pixel definition layer 350. The common electrode 193 may be on the entire display panel 100 without regard to pixels. One of the pixel electrode 191 and the common electrode 193 injects holes to the emission layer 192, and the other injects electrons to the emission layer 192. The electrons and holes are combined in the emission layer 192 to generate excitons. Light is emitted when the excitons drop from an excited state to a ground state.

The pixel electrode 191, the emission layer 192, and the common electrode 193 collectively form an organic light emitting diode (OLED). The pixel electrode 191 may be formed of a reflective layer, and the common electrode 193 may be formed of a transparent layer or a transflective layer. In this case, light emitted from the emission layer 192 is reflected from the pixel electrode 191 and is transmitted through the common electrode 193 and emitted to the outside. When the common electrode 193 is formed of the transflective layer, part of the light reflected from the pixel electrode 191 is again reflected from the common electrode 193, thereby forming a resonance structure and increasing light extraction efficiency.

A thin film encapsulation layer 30 encapsulates the organic light emitting diode (OLED), thereby preventing penetration of external moisture and oxygen because the organic light emitting diode (OLED) is vulnerable to the moisture and oxygen. In one embodiment, the thin film encapsulation layer 30 may be configured of a multilayer of an inorganic layer and an organic layer. For example, the thin film encapsulation layer 30 may include a capping layer 31, a first inorganic layer 32, an organic layer 33, and a second inorganic layer 34 sequentially deposited on the common electrode 193.

The capping layer 31 may include, for example, LiF. The first inorganic layer 32 and the second inorganic layer 34 may include, for example, $Al_2O_3$, $SiN_x$, or $SiO_2$. The organic layer 33 may include, for example, epoxy, acrylate, or urethane acrylate. The thin film encapsulation layer 30 has a relatively very thin thickness, which may reduce the thickness of the display device, making it suitable as a flexible display device.

As illustrated in FIG. 5, a dam 130 may be in the peripheral area PA to prevent outflow of organic material generated when the organic material forming the thin film encapsulation layer 30 is over-coated. The thin film encapsulation layer 30 covers and is on the dam 130. In the present exemplary embodiment, only one dam 130 is illustrated. In another embodiment, a plurality of dams 130 may be in the peripheral area PA.

The touch sensor 200 is on the thin film encapsulation layer 30.

As illustrated in FIGS. 1 to 4, the touch sensor 200 may include sensing electrodes 241 and 242 in the display area DA and connection wirings 247 and 248 in the peripheral area PA outside the display area DA.

The sensing electrodes 241 and 242 may include a first sensing electrode 241 extending in a first direction X and a second sensing electrode 242 extending in a second direction Y crossing the first direction X. The connection wirings 247 and 248 may include first connection wiring 247 connected to the first sensing electrode 241 and second connection wiring 248 connected to the second sensing electrode 242.

The first sensing electrode 241 may include a plurality of first sensing cells 241a having a predetermined (e.g., an approximate rhombus) shape and a plurality of first connection parts 241b extending in the first direction X and connecting the first sensing cells 241a. The first sensing electrode 241 may be a Tx touch electrode (transmitter touch electrode) to which is transmitted a first touch signal to sense a coordinate value of the second direction Y.

The second sensing electrode 242 may include a plurality of second sensing cells 242a having a predetermined (e.g., approximate rhombus) shape, and a plurality of second connection parts 242b extending in the second direction Y and connecting the second sensing cells 242a. The second sensing electrode 242 may be an Rx touch electrode (receiver touch electrode) to which is transmitted a second touch signal to sense a coordinate value of the first direction X. In the present exemplary embodiment, the first sensing cells 241a and the second sensing cells 242a are illustrated to have a rhombus shape, but may have different shapes in another embodiment.

The first sensing electrode 241 and the second sensing electrode 242 may be on different layers. The first sensing cells 241a and the second sensing cell 242a are adjacent to each other on a plane. The first connection parts 241b and the second connection parts 242b may overlap each other or may be insulated by an insulating layer.

The sensing electrodes 241 and 242 may be formed from a low resistance metal (e.g., silver (Ag), aluminum (Al), copper (Cu), chromium (Cr), or nickel (Ni)) or a conductive nano-material, e.g., silver nanowires or carbon nanotubes. These detection electrodes 241 and 242 may have low resistance to reduce RC delay and excellent flexibility so that cracks do not form easily from repeated deformation, e.g., warping.

The touch sensor 200 may have, for example, a mesh shape. In one embodiment, the sensing electrodes 241 and 242 may be made of a plurality of first fine lines 41, and the connection wirings 247 and 248 may be made of a plurality of second fine lines 42. FIG. 4 illustrates an example structure where the first connection wiring 247 is made of the plurality of second fine lines 42. In one embodiment, the second connection wiring 248 may also be made of the second fine lines 42 like the first connection wiring 247.

As described above, the sensing electrodes 241 and 242 have a mesh shape made of the plurality of first fine lines 41. As a result, light emitted from the displaying member 20 (or display element) is not blocked and an area overlapping the common electrode 193 is reduced, thereby reducing or minimizing parasitic capacitance.

The touch sensor 200 may use the display panel 100 as a support plate without using its own support plate. Accordingly, because the entire thickness of the touch sensor 200 is relatively very thin, the display device may have a reduced thickness making it suitable for use as a flexible display device.

As illustrated in FIG. 5, a first insulating layer 210 is between the thin film encapsulation layer 30 and the touch sensor 200. The first insulating layer 210 may include a first region 211 overlapping a part of the second fine lines 42, and a second region 212 as a region except for the first region 211. A dielectric constant of the first region 211 may be lower than the dielectric constant of the second region 212. For example, the first region 211 may have a dielectric constant of lower than 7.7. The second region 212 may have a dielectric constant of more than 7.7. The first region 211 may be formed of an inorganic material, e.g., silicon nitride ($SiN_x$) or a silicon oxide ($SiO_x$). The second region 212 may be formed of an organic material.

The dam 130 and the connection wiring 247 may overlap each other on a plane view in the peripheral area PA. In this case, the first region 211 may be between the dam 130 and the connection wiring 247. FIG. 4 illustrates that the first region 211 is formed to have a square ring shape on a plane view. The first region 211 may have a different shape in another embodiment. Also, FIG. 4 illustrates that the first region 211 has one square ring shape. In another embodiment, the first region 211 may have a plurality of square ring shapes in a repeating pattern.

Accordingly, because the first region 211 has a low dielectric constant between the common electrode 193 and the connection wiring 247 that are positioned on the dam 130, the parasitic capacitance may be reduced or minimized between the common electrode 193 and the connection wiring 247. Accordingly, product defects may be prevented by reducing or minimizing parasitic capacitance by the connection wiring 247 of the touch sensor 200. Also, because there is no need to increase the thickness of the thin film encapsulation layer 30 to reduce or minimize the parasitic capacitance, manufacturing costs may be reduced by reducing or minimizing the thickness of the thin film encapsulation layer 30.

On the other hand, as illustrated in FIG. 5, a second insulating layer 220 is on and covers the sensing electrode 241, the connection wiring 247, and the first insulating layer 210. The second insulating layer 220 may be formed, for example, of organic material.

Auxiliary wiring 249 for resistance reduction may be on the second insulating layer 220. The auxiliary wiring 249 may be connected to the sensing electrode 241 and the connection wiring 247. The auxiliary wiring 249 may be formed, for example, of the same material as the sensing electrode 241 and the connection wiring 247.

The auxiliary wiring 249 may be made of a plurality of third fine lines 43, which are connected to each other to form a mesh shape. The third fine lines 43 overlap the second fine lines 42, thereby resultantly overlapping the first region 211 on a plane view. In FIG. 5, the touch sensor 200 is connected to the auxiliary wiring 249. For convenience of explanation, only the first sensing electrode 241 and the first connection wiring 247 are illustrated. A third insulating layer 240 is on and covers the auxiliary wiring 249 and the second insulating layer 220.

Figure 7:
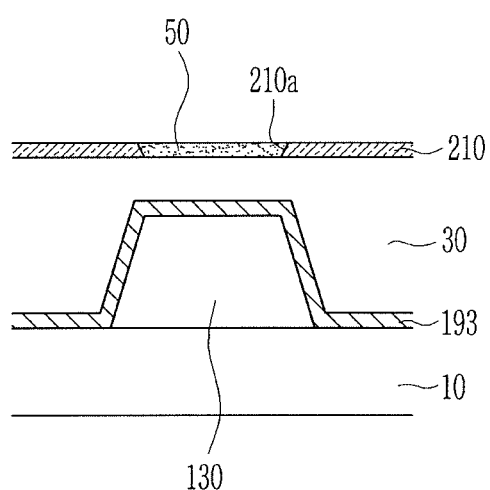
FIGS. 7 to 11 illustrate various stages of an embodiment of a method for manufacturing a display device.

FIGS. 7 to 11 are cross-sectional views of various stages of an embodiment of a method for manufacturing a display device. Referring to FIGS. 5 and 7, the method includes as an initial operation forming a displaying member 20 on a substrate 10. A dam 130 is formed on the substrate 10 in a peripheral area PA, and a common electrode 193 is formed on the dam 130. A thin film encapsulation layer 30 is formed to cover the displaying member 20 and the dam 130. A first insulating layer 210 is formed on the thin film encapsulation layer 30. The first insulating layer 210 is patterned to form an opening 210a. A conductive layer 50 is formed on the first insulating layer 210. The conductive layer 50 may include, for example, copper (Cu) which may be suitable for executing a CMP process. The CMP process may be performed to planarize the conductive layer 50, so that the top surface of the conductive layer 50 coincides with the top surface of the first insulating layer 210.

Figure 8:
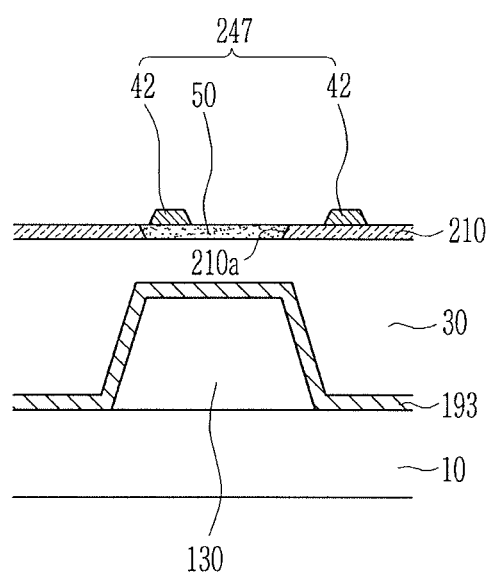

Next, as illustrated in FIG. 8, connection wiring 247 of a touch sensor 200 is formed on the first insulating layer 210 and the conductive layer 50. The opening 210a is filled by the conductive layer 50 to allow the connection wiring 247 to be easily formed on the conductive layer 50.

Figure 9:
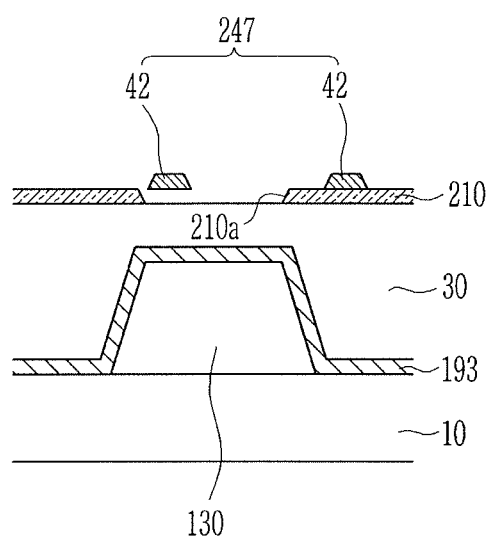

Next, as illustrated in FIG. 9, an etching process is performed to remove the conductive layer 50 filled in the opening 210a. Accordingly, the opening 210a remains as an empty space.

Figure 10:
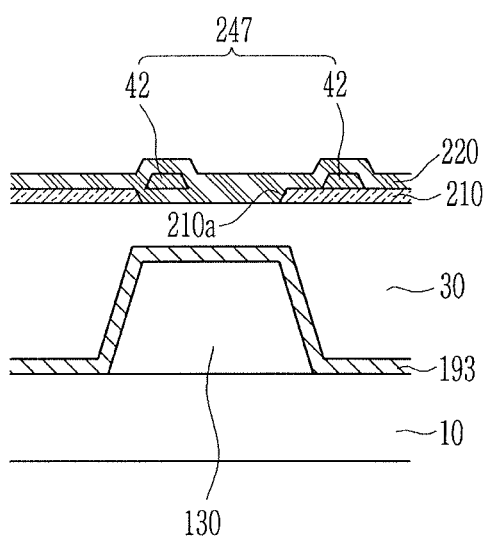

Next, as illustrated in FIG. 10, a second insulating layer 220 is formed on the connection wiring 247. The second insulating layer 220 may include the organic material. The dielectric constant of the second insulating layer 220 is lower than the dielectric constant of the first insulating layer 210. At this time, when the second insulating layer 220 contains the organic material of a low viscosity, fluidity is high. As a result, part of the organic material flows down and fills the opening 210a. The opening 210a filled by the second insulating layer 220 corresponds to the first region 211 of the first insulating layer 210.

Figure 11:
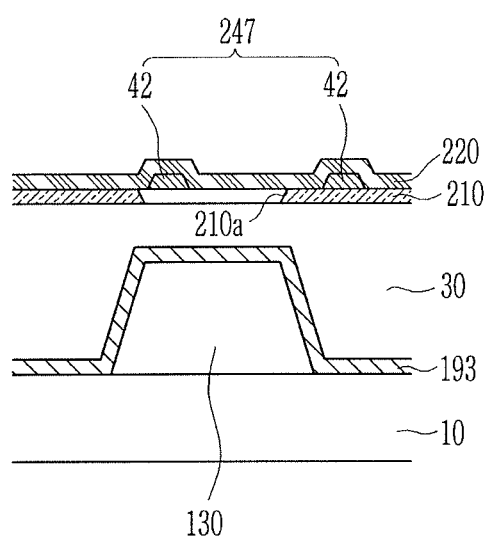

Also, as illustrated in FIG. 11, when the second insulating layer 220 contains the organic material of a high viscosity, the organic material does not fill the opening 210a. In this case, the opening 210a of the empty space corresponds to the first region 211 of the first insulating layer 210.

When a display device is formed by the above-described manufacturing method, parasitic capacitance between the common electrode 193 and the connection wiring 247 may be reduced or minimized because the first region 211 of a low dielectric constant is between the common electrode 193 and the connection wiring 247 on the dam 130.

On the other hand, in the manufacturing method of the display device according to an exemplary embodiment of FIGS. 7 to 11, the separate conductive layer fills the opening. Then, the conductive layer is removed after forming the connection wiring. In another exemplary embodiment, the separate organic layer may fill the opening and the connection wiring is formed is possible.

Figure 12:
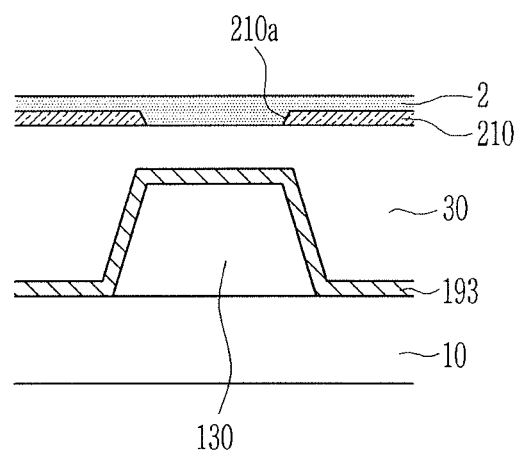
FIGS. 12 and 13 illustrate another embodiment of a method for manufacturing a display device.
Figure 13:
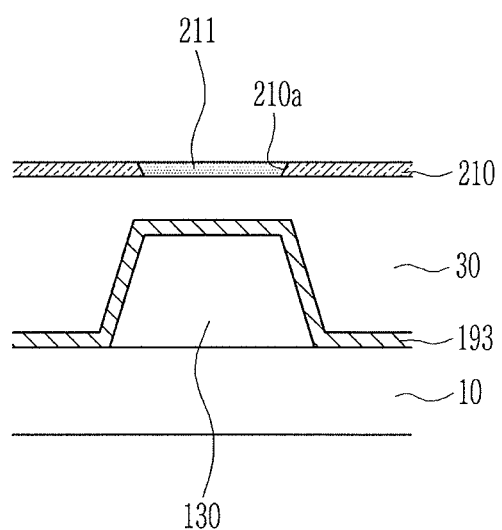

FIGS. 12 and 13 illustrate cross-sectional views sequentially showing stages corresponding to another embodiment of a method for manufacturing a display device.

Referring to FIGS. 5 and 12, the method includes as an initial operation forming the displaying member 20 on the substrate 10. The dam 130 is formed in the peripheral area PA on the substrate 10, and the common electrode 193 is formed on the dam 130. The thin film encapsulation layer 30 is formed to cover the displaying member 20 and the dam 130. The first insulating layer 210 is formed on the thin film encapsulation layer 30. The first insulating layer 210 is patterned to form the opening 210a. The organic layer 2 is formed on the first insulating layer 210 and fills the opening 210a.

Next, as illustrated in FIG. 13, the organic layer is entirely exposed to entirely remove the part of the organic layer. Accordingly, because the organic layer is removed except for the organic layer filled in the opening, the first insulating layer is left exposed. Accordingly, the top surface of the organic layer coincides with the top surface of the first insulating layer. The organic layer corresponds to the first region of the first insulating layer.

Next, as illustrated in FIG. 5, the connection wiring 247 of the touch sensor 200 is formed on the first insulating layer 210 and the organic layer 2. Since the opening 210a is filled by the organic layer 2, the connection wiring 247 is easily formed on the organic layer 2. Also, the second insulating layer 220 is formed on the connection wiring 247.

When a display device is formed by the above-described manufacturing method, parasitic capacitance between the common electrode 193 and the connection wiring 247 may be reduced or minimized because the first region 211 having the low dielectric constant is between the common electrode 193 and the connection wiring 247 on the dam 130.

In addition, in an exemplary embodiment illustrated in FIGS. 1 to 6, the first region of the first insulating layer overlaps the connection wiring. In one exemplary embodiment, the first region may be positioned at a region overlapping the sensing electrode as well as the connection wiring.

Figure 14:
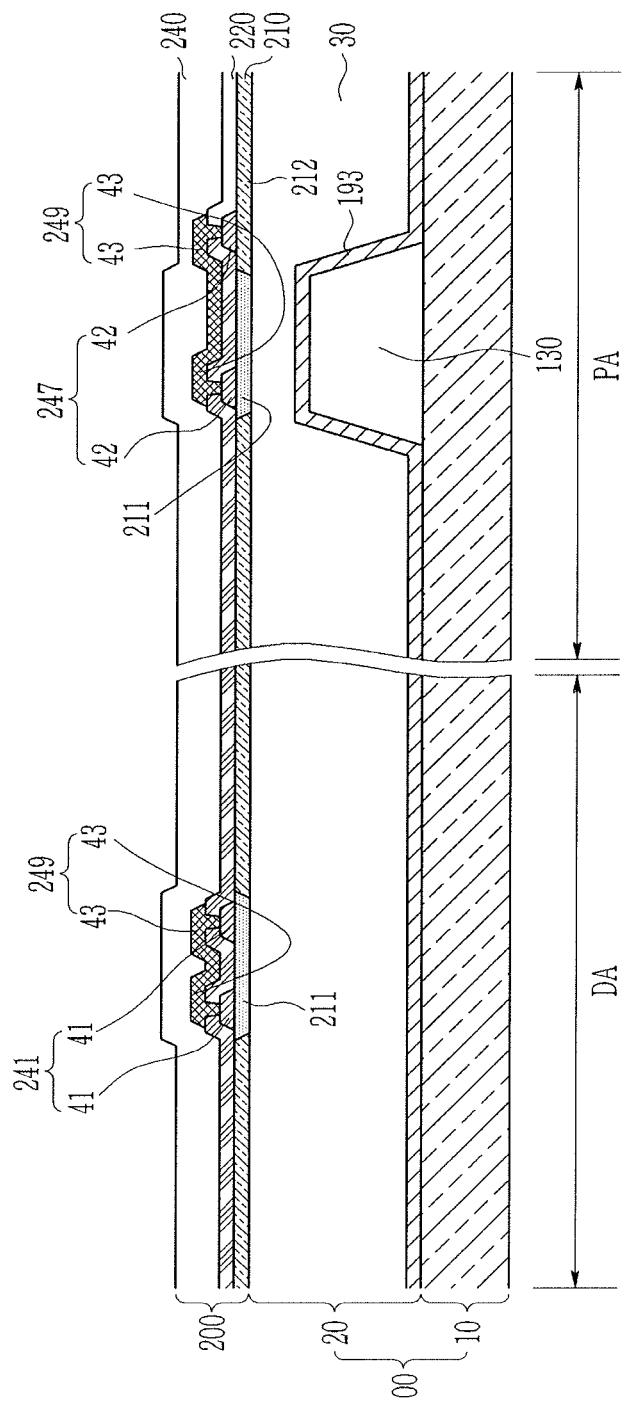
FIG. 14 illustrates another embodiment of a display device.

FIG. 14 illustrates a cross-sectional view of another embodiment of a display device. The exemplary embodiment of FIG. 14 may be substantially the same as the exemplary embodiment of FIG. 5, except for the structure of the first region.

Referring to FIG. 14, the first insulating layer 210 is between the thin film encapsulation layer 30 and the touch sensor 200. The first insulating layer 210 may include the first region 211 overlapping part of the first fine lines 41 and the second fine lines 42 and the second region 212 as the region except for the first region 211. Thus, the first region 211 may be between the displaying member 20 of the display area DA and the sensing electrode 241 and may be between the dam 130 of the peripheral area PA and the connection wiring 247. The dielectric constant of the first region 211 may be lower than the dielectric constant of the second region 212.

Since the first region 211 of the low dielectric constant overlaps the first fine lines 41 of the sensing electrode 241 on a plane view, parasitic capacitance with the common electrode 193 positioned in the displaying member 20 may be reduced or minimized.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
a substrate including a peripheral area around a display area;
a dam in the peripheral area;
a display element in the display area including a common electrode that is on the dam in the peripheral area;
a thin film encapsulation layer covering the dam and the display element;
a touch sensor on the thin film encapsulation layer; and
a first insulating layer between the thin film encapsulation layer and the touch sensor and having a first region and a second region, wherein a dielectric constant of the first region is lower than a dielectric constant of the second region and wherein the first region is between the dam and the touch sensor and overlaps the dam, and
wherein in the peripheral area, a first distance between the first region and the common electrode is smaller than a second distance between the second region and the common electrode.

2. The display device as claimed in claim 1, wherein:
the touch sensor includes a sensing electrode in the display area and connection wiring in the peripheral area,
the connection wiring overlaps the dam on a plane view, and
the first region is between the dam and the connection wiring.

3. The display device as claimed in claim 2, wherein the first region overlaps part of the connection wiring on a plane view.

4. The display device as claimed in claim 2, wherein:
the sensing electrode includes a plurality of first fine lines,
the connection wiring includes a plurality of second fine lines,
the plurality of first fine lines are connected to have a mesh shape,
the plurality of second fine lines are connected to have a mesh shape, and
the second fine lines overlap the first region on a plane view.

5. The display device as claimed in claim 4, further comprising:
a second insulating layer covering the sensing electrode, the connection wiring, and the first insulating layer;
auxiliary wiring on the second insulating layer and connected to the sensing electrode and the connection wiring; and
a third insulating layer covering the auxiliary wiring and the second insulating layer, wherein the auxiliary wiring includes a plurality of third fine lines, the plurality of third fine lines are connected to have a mesh shape, and the third fine lines overlap the first region on a plane view.

6. The display device as claimed in claim 4, wherein:
the first region is between the display element and the sensing electrode, and
the first region overlaps the sensing electrode on a plane view.

7. The display device as claimed in claim 6, wherein the first fine lines overlap the first region on a plane view.

8. The display device as claimed in claim 1, wherein:
the display element further includes a transistor and an organic light emitting diode connected to the transistor,
the organic light emitting diode includes a first electrode facing the common electrode and an emission layer between the first electrode and the common electrode,
the common electrode is on the dam, and
the first region overlaps the common electrode on the dam.

9. A method for manufacturing a display device, the method comprising:
forming a display element on a substrate including a common electrode that is on a dam in a peripheral area of the substrate;
forming a thin film encapsulation layer covering the display element and the dam;
forming a first insulating layer on the thin film encapsulation layer;
patterning the first insulating layer to form an opening;
filling a conductive layer in the opening and planarizing the conductive layer;
forming a touch sensor on the first insulating layer and the conductive layer;
removing the conductive layer; and
forming a second insulating layer on the touch sensor, wherein the first insulating layer has a first region and a second region, the first region overlapping the dam, wherein a dielectric constant of the first region is lower than a dielectric constant of the second region, and wherein in the peripheral area, a first distance between the first region and the common electrode is smaller than a second distance between the second region and the common electrode.

10. The method as claimed in claim 9, wherein:

the second insulating layer fills the opening to form a first region of the first insulating layer, and the dielectric constant of the first region is lower than the dielectric constant of a second region as a remaining region of the first insulating layer.

11. The method as claimed in claim 9, wherein:

the peripheral area of the substrate is around a display area of the substrate, the touch sensor includes a sensing electrode in the display area and connection wiring in the peripheral area, and the connection wiring overlaps the first region on a plane view.

12. The method as claimed in claim 11, wherein:

the sensing electrode includes a plurality of first fine lines, the connection wiring includes a plurality of second fine lines, the plurality of first fine lines are connected to have a mesh shape, the plurality of second fine lines are connected to have a mesh shape, and the second fine lines overlap the first region on a plane view.

13. The method as claimed in claim 9, wherein:

the second insulating layer does not fill the opening, and the opening forms a first region of the first insulating layer.

14. A method for manufacturing a display device, the method comprising:

forming a display element on a substrate including a common electrode that is on a dam in a peripheral area of the substrate;

forming a thin film encapsulation layer covering the display element and the dam;

forming a first insulating layer on the thin film encapsulation layer;

patterning the first insulating layer to form an opening;

forming an organic layer on the first insulating layer;

entirely exposing the organic layer for planarizing the organic layer filled in the opening;

forming a touch sensor on the first insulating layer and the organic layer; and forming a second insulating layer on the touch sensor, wherein the organic layer fills the opening to form a first region of the first insulating layer and overlap the dam, wherein the dielectric constant of the first region is lower than the dielectric constant of a second region as a remaining region of the first insulating layer, and wherein in the peripheral area, a first distance between the first region and the common electrode is smaller than a second distance between the second region and the common electrode.

15. The method as claimed in claim 14, wherein:

the peripheral area of the substrate is around a display area of the substrate, the touch sensor includes a sensing electrode in the display area and connection wiring in the peripheral area, and the connection wiring overlaps the first region on a plane view.

16. The method as claimed in claim 15, wherein:

the sensing electrode includes a plurality of first fine lines, the connection wiring includes a plurality of second fine lines, the plurality of first fine lines are connected to have a mesh shape, the plurality of second fine lines are connected to have a mesh shape, and the second fine lines overlap the first region on a plane view.

* * * * *